(12) United States Patent
Namekawa

(10) Patent No.: US 6,529,406 B1
(45) Date of Patent: Mar. 4, 2003

(54) SEMICONDUCTOR DEVICE WITH POWER SUPPLY WIRINGS AND EXPANDED WIRABLE REGIONS FOR USERS

(75) Inventor: Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/991,958

(22) Filed: Nov. 26, 2001

(30) Foreign Application Priority Data

Sep. 25, 2001 (JP) ........................................ 2001-292001

(51) Int. Cl.$^7$ .............................................. G11C 16/04
(52) U.S. Cl. ............................ 365/185.06; 365/185.26
(58) Field of Search ................................. 257/202, 203, 257/204, 207, 208, 210, 211, 390, 5, 391; 365/185.26, 185.06, 185.11

(56) References Cited

U.S. PATENT DOCUMENTS 5,153,685 A * 10/1992 Murata et al. ............. 357/23.6
5,969,420 A * 10/1999 Kuge et al. ................. 257/758

FOREIGN PATENT DOCUMENTS

JP        406209093 A   *  7/1994

OTHER PUBLICATIONS

Yuji Yokoyama, et al., "A 1.8–V Embedded 18–Mb DRAM MACRO with A 9–ns RAS Access Time and Memory–Cell Area Efficiency of 33%", IEEE Journal of Solid–State Circuits, vol. 36, No. 3, Mar. 2001, pp. 503–509.

* cited by examiner

Primary Examiner—Olik Chaudhuri
Assistant Examiner—Dana Farahani
(74) Attorney, Agent, or Firm—Oblon, Spivak, McClelland, Maier & Neustadt, P.C.

(57) ABSTRACT

A plurality of basic unit blocks include a memory cell array and first data lines transmitting data read out from memory cell arrays. Second data lines are arranged in an upper layer in a plurality of basic unit blocks. First power supply wirings are arranged along the second data lines. Second power supply wirings are arranged in a direction orthogonal to the first power supply wirings in the upper layer of the basic unit block of the plurality of basic unit blocks which is positioned on one end. The second power supply wirings are arranged in the same layer where the first power supply wirings are formed, and are connected to the first wirings.

20 Claims, 13 Drawing Sheets

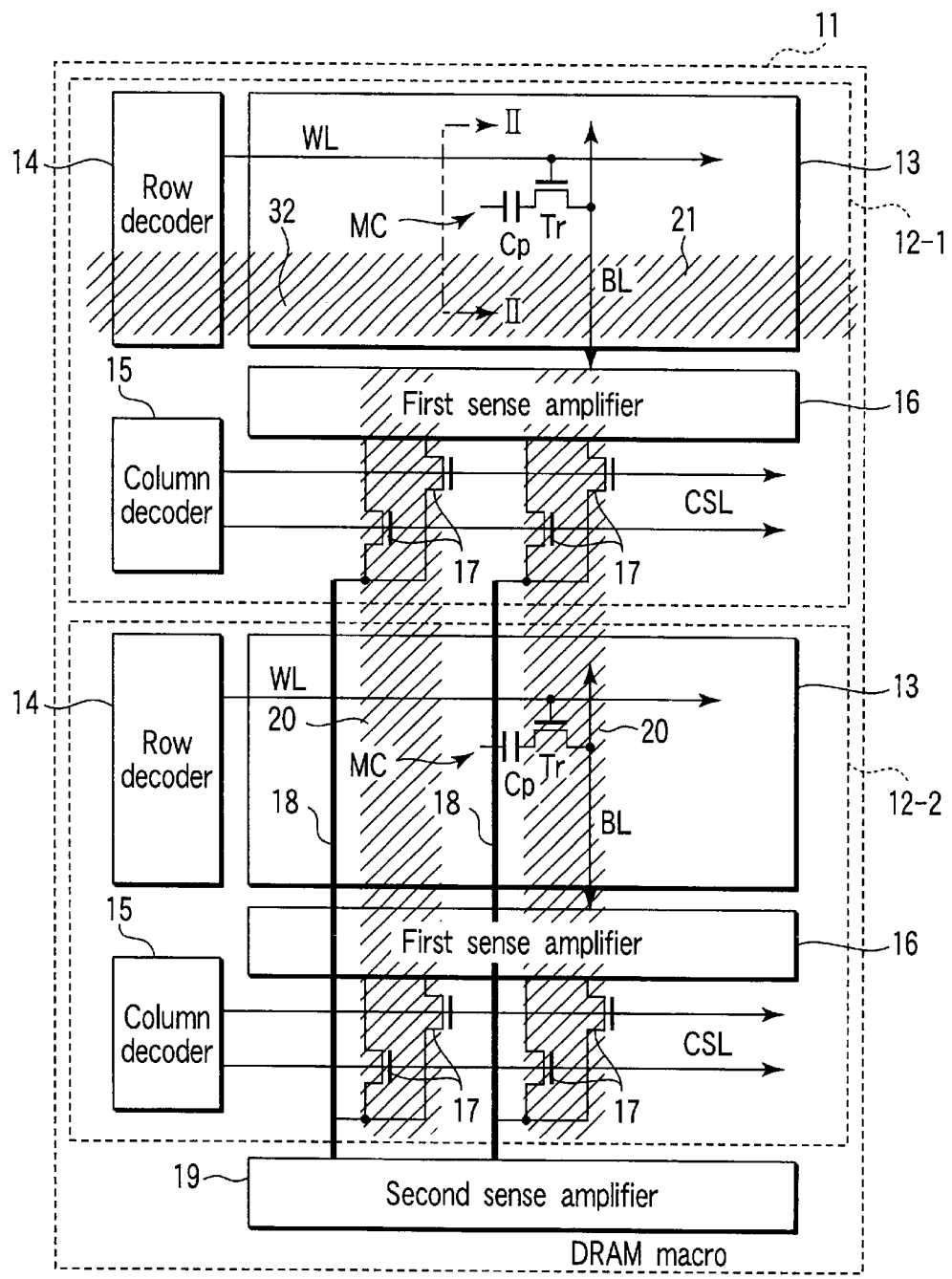
F I G. 1

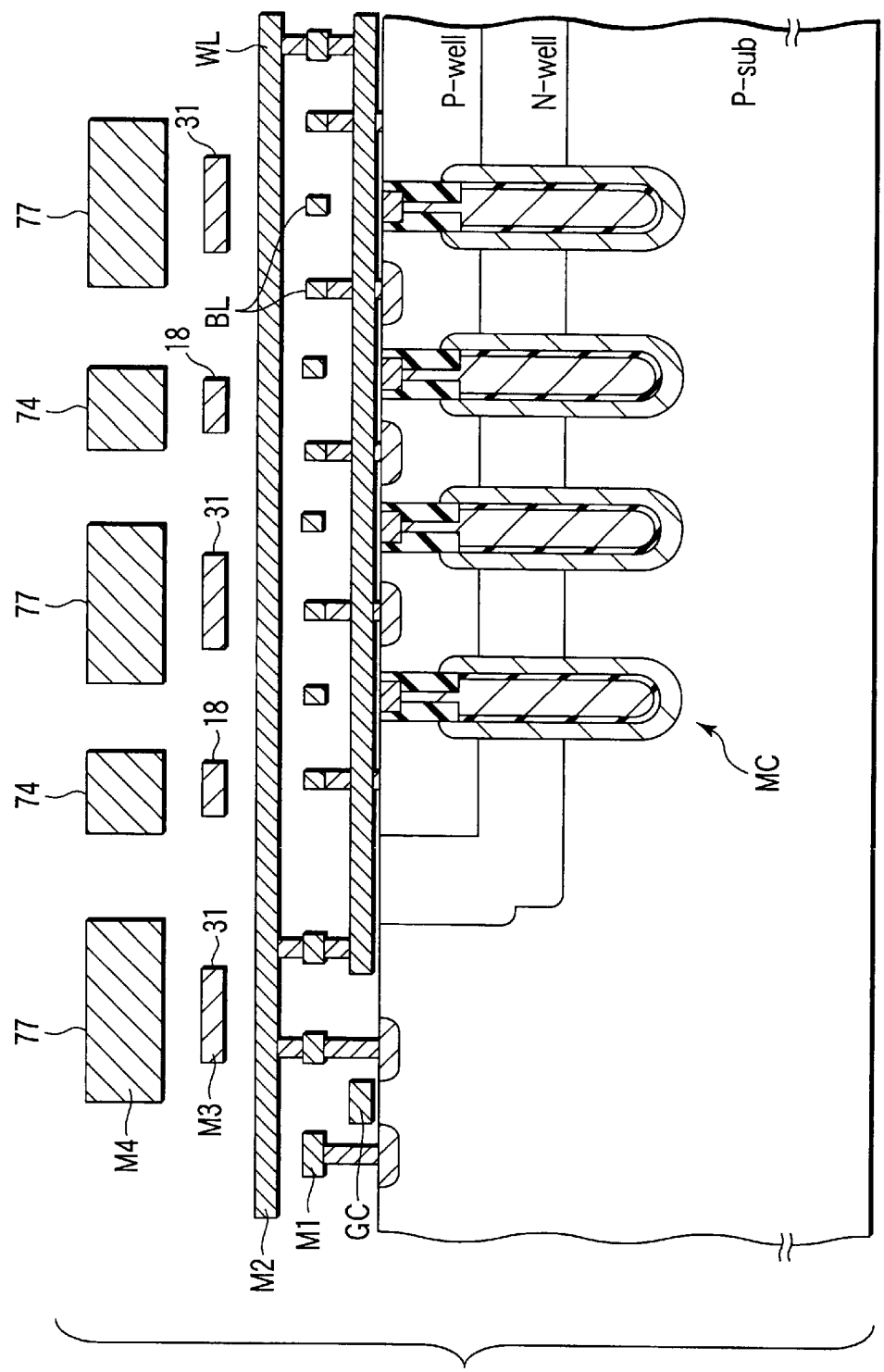
F I G. 11

SEMICONDUCTOR DEVICE WITH POWER SUPPLY WIRINGS AND EXPANDED WIRABLE REGIONS FOR USERS

CROSS-REFERENCE TO RELATED APPLICATIONS

This application is based upon and claims the benefit of priority from the prior Japanese Patent Application No. 2001-292001, filed Sep. 25, 2001, the entire contents of which are incorporated herein by reference.

BACKGROUND OF THE INVENTION

1. Field of the Invention

The present invention relates to a semiconductor device, for example, ASIC (Application Specific Integrated Circuits), particularly to a memory macro installed with a logic circuit or the like.

2. Description of the Related Art

Recently, the multilevel interconnection technique has progressed, and data lines such as global wirings having a wide bus width, which comprises as many as 128 lines or more, are wired in a memory cell array. Such global wirings are often formed on a thick upper wiring layer to prevent signal-delay. On the other hand, these global wirings are hardly laid out on the whole area of a memory cell array so as to cover it. These global wirings generally are laid out with power supply wirings and other passing wirings. These power supply wirings and other passing wirings are arranged between global wirings in parallel with the global wirings. A plurality of power supply wirings arranged on a memory cell array may be formed in a direction along the global wirings. Thereby the total amount of resistance of power supply wiring in the direction along the global wirings can be reduced. However, it is difficult to arrange power supply wirings in a direction orthogonal to the global wirings so as to cross the global wirings. Thus the number of global wirings is extremely limited and the length and arranged position thereof are also limited. For example, one power supply wiring is arranged on one end of the global wirings in the direction orthogonal to the global wirings. Thereby, the total amount of resistance of the power supply wirings arranged in the direction orthogonal to the global wirings increases. In such a conventional arrangement of power supply wirings, it is difficult to supply a sufficient voltage to the whole area of the memory cell array.

Also, in the case of the conventional layout, a wirable region to arrange passing wirings can be formed in only one direction parallel with the global wirings. Such a wirable region laid out in only one direction has little utility for users, and it is hardly utilized. To solve the problem, a wiring layer is formed on an upper layer in a direction orthogonal to the wirable region. However, this creates a problem of increasing the cost of production.

Recently, a memory macro applied for ASIC, for example, a DRAM (Dynamic RAM) macro has been developed energetically. In a DRAM macro, easing the limitation of positions of power supply pins arranged in a macro and limitation of wirable regions for users passing through an upper layer of a macro is particularly required. That is, the area of the DRAM macro occupies several 10% of the total chip. Therefore the position of the DRAM macro in chip has a big influence on the floor plan of chip. As stated previously, for example, in a DRAM macro whose power supply wirings have a low resistance direction and a high resistance direction, a plurality of power supply pins must be arranged on a certain side of a macro. Because of this limitation, it is required that a DRAM macro be arranged in the vicinity of a power supply pad arranged on a peripheral portion of the chip. Further, when the direction of a wirable region for users passing through onto the DRAM macro is limited, DRAM macros are arranged on four corners of a chip to satisfy the limitation.

Also, a DRAM macro is required to have high operating frequency, wide bit width of data lines and the like. When the operating frequency is increased, current consumption increases. It is required that more power supply wirings are installed to make up for the increased current consumption. However, power supply wirings arranged merely between data lines is hardly adequate, thus it is required that power supply wirings are additionally arranged particularly in a direction orthogonal to data lines.

On the other hand, hierarchising data lines is effective in enlarging the bit width of the data lines. It is required that a wiring layer is added in order to realize hierarchising of data lines. However, data wirings added, for enlarging the bit width are required to be arranged in a direction parallel with existing data lines. In such a structure, power supply wirings are also arranged in parallel with existing power supply wirings. Therefore, it is difficult to reinforce power supply wirings arranged in a direction orthogonal to data lines. Further, a wirable region for users cannot be provided in the direction orthogonal to data lines. That is, it is required that at least two wiring layers are added in order to reinforce power supply wirings, add the width of data lines and provide a wirable region for users. However, in this case, there arises a problem of increasing the manufacturing steps and cost. Under circumstances, there has been demand of semiconductor device which can increase the number of power supply wirings, secure effective wirable regions for users and prevent increasing costs.

BRIEF SUMMARY OF THE INVENTION

According to an aspect of the invention, there is provided a semiconductor device comprising: a plurality of basic unit blocks, each basic unit blocks including a memory cell array having a plurality of memory cells arranged in a matrix, a first selecting line selecting one memory cell from the memory cells; a first data line arranged so as to orthogonal-ize with the first selecting line, the first data line transmitting data from the selected memory cell; and a sense amplifier connected to the first data lines, a plurality of second data lines formed in an upper layer of other basic unit blocks of a plurality of the basic unit blocks except a basic unit block positioned on one end, the plurality of second data lines being formed in the same direction of the first data line and being connected to the first data line; a first wiring arranged in an upper layer of the plurality of basic unit blocks, the first wirings running parallel with the second data line; and a second wiring arranged in an upper layer of the basic unit block positioned on the one end, the second wiring being arranged in a direction orthogonal to the first wiring.

BRIEF DESCRIPTION OF THE SEVERAL VIEWS OF THE DRAWING

FIG. 1 is a circuit diagram showing wirable regions according to a first embodiment of the present invention;

FIG. 11 is a cross sectional view taken along the XI—XI line in FIG. 10;

DETAILED DESCRIPTION OF THE INVENTION

Figure 2:
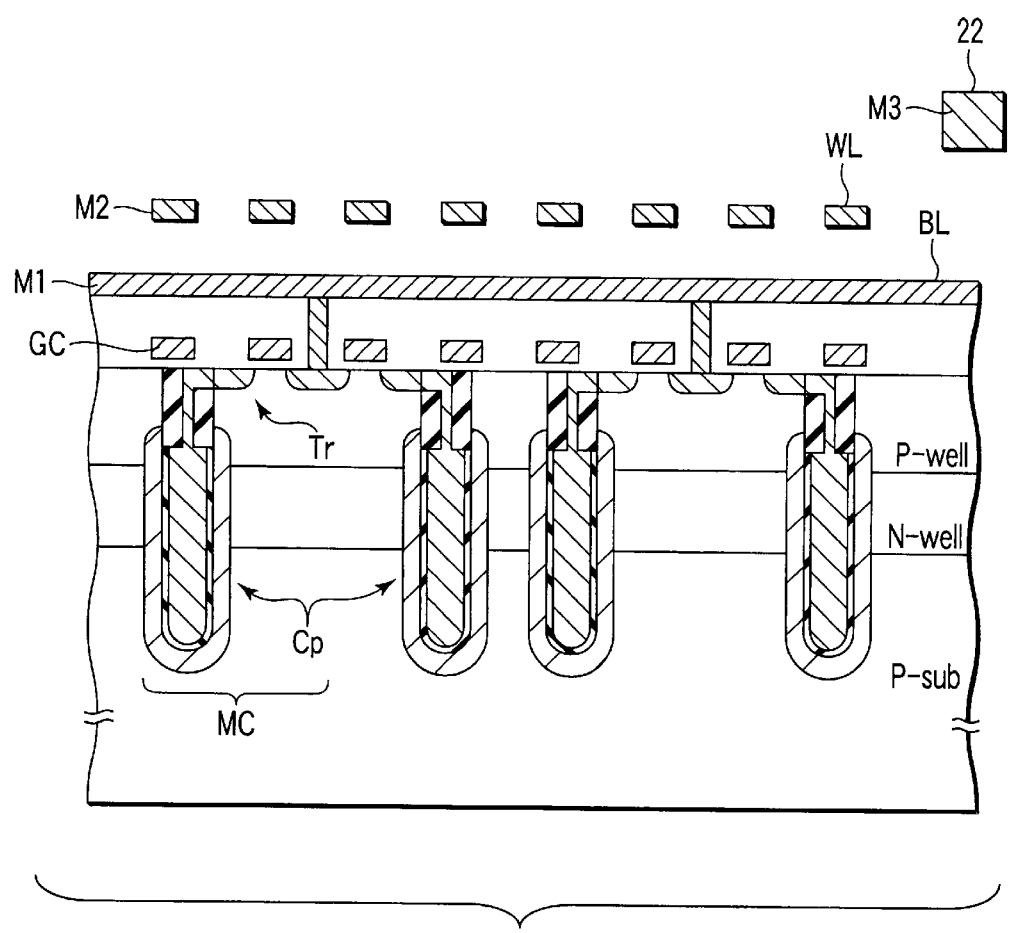
FIG. 2 is a cross sectional view taken along the II—II line in FIG. 1.

Hereinafter, embodiments of the present invention will be described with reference to the accompanying drawings.

First Embodiment

FIG. 1 shows an example of a memory macro according to a first embodiment of the present invention, for example, a DRAM macro. This DRAM macro 11 is comprised of for example, two basic unit blocks 12-1, 12-2 and a two-tired data line. The basic unit blocks 12-1 and 12-2 composing a first layer, have the same configuration. Thereby, a description will be given of the configuration of the basic unit block 12-1 and in the basic unit block 12-2, and same parts as those in the basic unit block 12-1 are identified by the same reference numerals.

The basic unit block 12-1 is comprised of a memory cell array 13, a row decoder 14, a column decoder 15, a first sense amplifier 16 and a plurality of selecting transistors 17. A plurality of memory cells MC are arranged in a matrix in the memory cell array 13. Each of the memory cells MC is comprised of, for example, one transistor Tr and one capacitor Cp. These memory cells MC are connected to a word line WL as a first selecting line and a bit line BL as a first data line. The memory cell array has, for example, a memory capacity of 1 Mbit, 512 word lines WL and 2048 bit lines BL.

The word lines WL are connected to the row decoder 14, and word lines WL are selected by the row decoder 14. The bit lines BL are connected to the first sense amplifier 16. The first sense amplifier 16 amplifies electric potential of the bit line BL. A plurality of column selecting lines CSL are connected to the column decoder 15. These column selecting lines CSL are connected to gates of the selecting transistors 17. One end of an electric current path of the selecting transistor 17 is connected to the first sense amplifier 16, the other end thereof is connected to a second data line to be described later. These selecting transistors 17 connect the bit lines BL with the second data lines in accordance with an output signal from the column decoder 15.

A plurality of second data lines 18 are formed on an upper layer of the basic unit block 12-2 in the same direction of the bit line BL. These second data lines 18 are connected to the other ends of the electric current paths of the selecting transistors 17 in the basic unit blocks 12-1 and 12-2. These second data lines 18 are connected to a second sense amplifier 19 adjacent to the basic unit block 12-2.

A plurality of first wirable regions 20 are arranged adjacent to the plurality of second data lines 18 in the upper layer of the basic unit blocks 12-1 and 12-2. The bit lines BL as first data lines are generally patterned as fine as possible by using a lithography technique in the DRAM. The selecting transistor 17 connects the bit lines BL with the second data lines 18. Thereby, the number of second data lines 18 is reduced to about ¼ or ⅛ the number of bit lines. Thereby, an extra region can be used as first wirable regions 20. The first wirable regions 20 are formed in the same wiring layer where the second data lines 18 are formed, for example, and it can be used for forming passing wirings for users.

In the basic unit block 12-1 positioned on an end portion of the DRAM macro 11, the second data lines 18 are not formed on the upper layer of the memory cell array 13. A second wirable region 21 is formed on this portion in a direction orthogonal to the first wirable region 20. The second wirable region 21 is formed on the same layer where the first wirable region 20 is formed. Also, the second wirable region 21 is used for forming, for example, passing wirings for users.

FIG. 2 shows a cross sectional view taken along the II—II line in FIG. 1. In FIG. 2, the same parts as those in FIG. 1 are identified by the same reference numerals.

Word lines WL are comprised of gate wiring layers GC formed of, for example, polysilicon and second wiring layers M2. The gate wiring layer GC and the second wiring layer M2 are short-circuited in several points of a memory cell array by contacts (not shown). The reason for composing the word line by two wiring layers is to reduce the transmission delay of signals occurring at the gate wiring layers GC having a high resistance.

On the other hand, the bit line BL is comprised of a first wiring layer M1 positioned between the gate wiring layer GC and the second wiring layer M2.

A passing wiring 22 is comprised of a third wiring layer M3. The passing wiring 22 is arranged on the second wirable region 21. Also, the second data lines 18 are comprised of the third wiring layer M3, not shown in FIG. 2.

Figure 3:
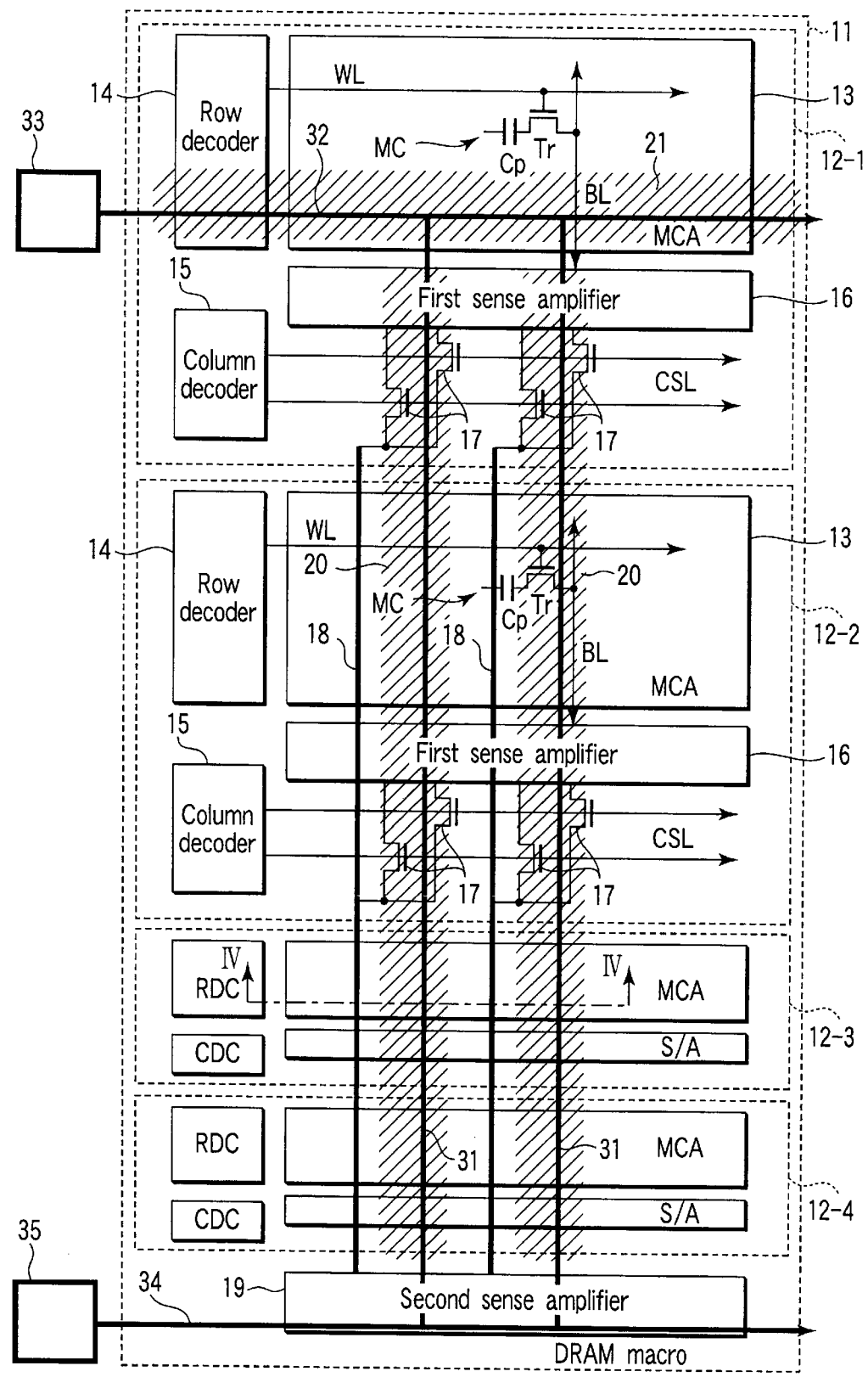
FIG. 3 is a circuit structural diagram showing power supply wirings according to the first embodiment of the present invention.

FIG. 3 shows an example that the first wirable region 20 and the second the wirable region 21 shown in FIG. 1, are used for a laid down region for power supply wirings of the DRAM macro 11. In FIG. 3, a detailed description is omitted by attaching the same numerals to the same parts as those in FIG. 1.

The DRAM macro 11 shown in FIG. 3 further has two basic unit blocks 12-3 and 12-4. The configuration of the two basic unit blocks 12-3 and 12-4 is the same as that of the basic unit blocks 12-1 and 12-2. These basic unit blocks 12-3 and 12-4 are formed in the first layer as in the basic unit blocks 12-1 and 12-2. The second data lines 18 are arranged above these basic unit blocks 12-2, 12-3 and 12-4. The first wirable regions 20 are formed in the same direction of the second data lines 18 above the basic unit blocks 12-1 to 12-4. A first power supply wiring 31 is formed along the second data lines 18 in each first wirable region 20. The first power supply wiring 31 is arranged in the same layer where the second data lines 18 are formed.

Also, a second power supply wiring 32 is formed in the second wirable region 21. One end of the second power supply wiring 32 is connected to, for example, a power supply pad 33 arranged on a peripheral portion of a semiconductor chip. The second power supply wiring 32 is connected to one end of each first power supply wiring 31.

Furthermore, for example, a third power supply wiring 34 is formed in parallel with, for example, the second power supply wiring 32 in the upper layer of the second sense amplifier 19. One end of the third power supply wiring 34 is connected to, for example, a power supply pad 35 arranged on a peripheral portion of a semiconductor chip. The third power supply wiring 34 is connected to the other end of each first power supply wiring 31. Thereby, electric power is supplied to the plurality of first power supply wirings 31 via the second and third power supply wirings 32 and 34.

Figure 4:
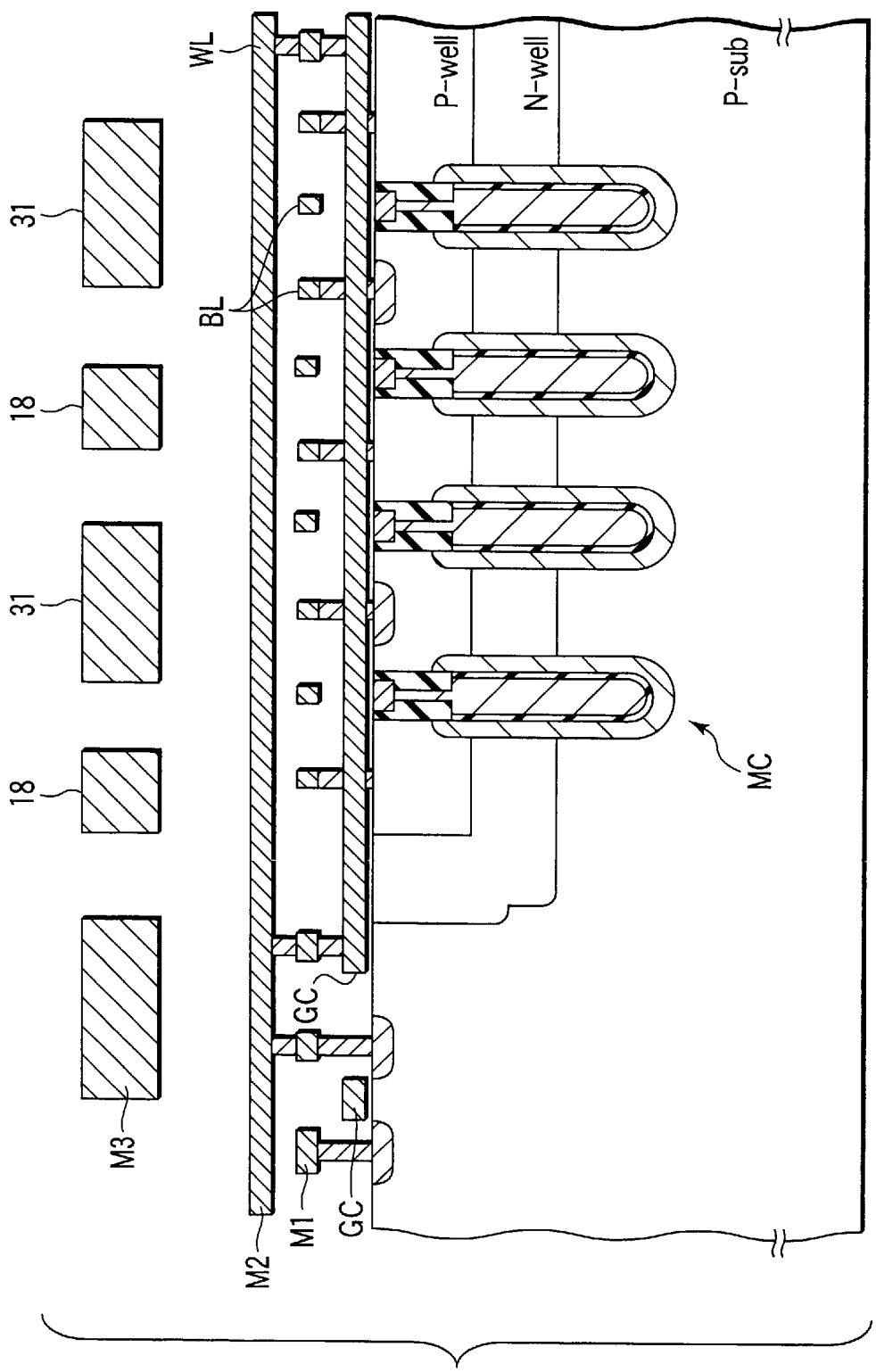
FIG. 4 is a cross sectional view taken along the IV—IV line in FIG. 3.

FIG. 4 is a cross sectional view taken along the IV—IV line in FIG. 3. As shown in FIG. 4, the second data lines 18 and the first power supply wiring 31 are formed by the third wiring layer M3.

When the storage capacity of a memory is increased, the wiring length of the second data lines 18 needs to be increased. The use of a thick upper layer for the second data lines 18 is effective in preventing a transmission delay of signals involved by long wiring length as well as the wiring layer M3. Needless to say, the thick wiring layer is effective as a power supply wiring. As stated previously, the first wiring layer M1 is used for bit lines BL as first data lines in the memory cell array, and the second wiring layer M2 is used for word lines WL. These first and second wiring layers M1, M2 are formed as narrow as possible, by using a lithography technique, to be mountable on the memory cell array having a high density. Since arrangement at a narrow interval is enhanced, the thickness of the first and second wiring layers M1, M2 are thin enough. On the contrary, the thickness of the third wiring layer M3 is set so as to be about double the thickness of the first and second wiring layers M1, M2. Thereby, resistance of the third wiring layer (M3) is low, and because of reducing the capacity between the third wiring layer (M3) and a lower layer, it is possible to reduce the power consumption and transmit signals at high speed.

Figure 5A:
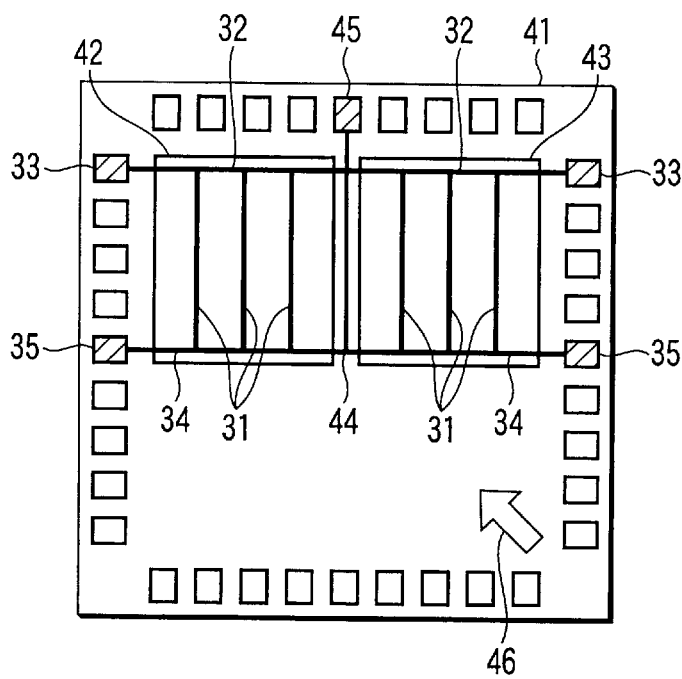
FIG. 5A is a plan view schematically showing a semiconductor chip to simulate operating of the first embodiment.
Figure 5B:
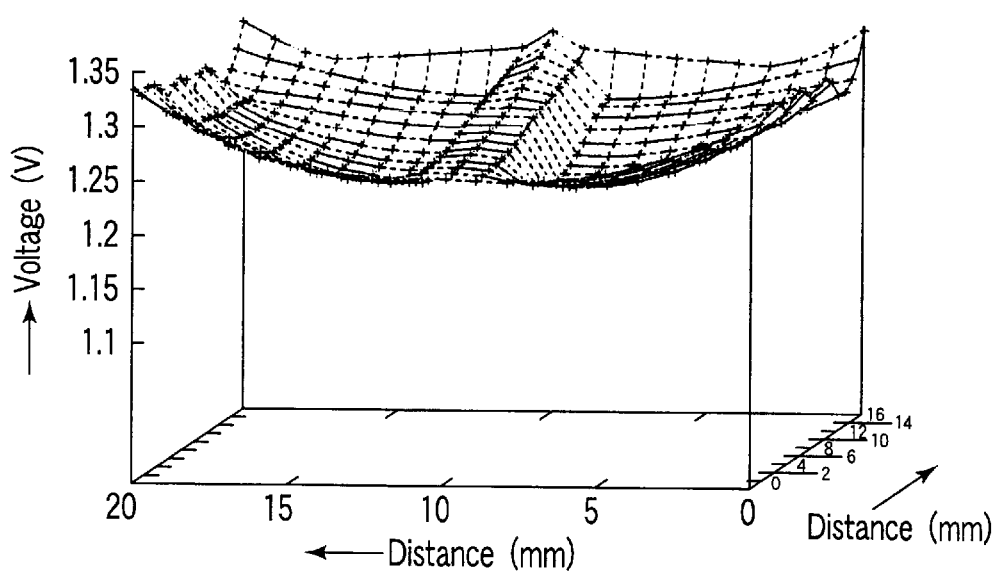
FIG. 5B is a characteristic diagram showing the result of simulation of the semiconductor chip shown in FIG. 5A.

FIGS. 5A and 5B show the operations of the first embodiment, FIG. 5A shows a schematic diagram of a semiconductor chip being applied to a simulation, and FIG. 5B shows the result of the simulation.

As shown in FIG. 5A, a semiconductor chip 41 has, for example, two DRAM macros 42 and 43. In FIG. 5A, the same parts as those in FIG. 3 are identified by the same reference numerals. A power supply wiring 44 is formed between the DRAM macros 42 and 43. One end of the power supply wiring 44 is connected to a power supply pad 45. The power supply wiring 44 is connected to each of the second and third power supply wirings 32 and 34 of the DRAM macros 42 and 43.

In the structure, electric power is supplied to the DRAM macros 42 and 43 from the power supply pads 33 and 35, and the electric potential at each of the DRAM macros 42 and 43 is simulated.

FIG. 5B shows the results of simulation observed at an arrow sign 46 shown in FIG. 5A. As shown in FIG. 5B, in the structure shown in the first embodiment, the drop in the electric potential at each of the DRAM macros 42 and 43 is little. That is to say, it is possible to supply an equal electric potential across the whole area of the DRAM macros 42 and 43.

Figure 6A:
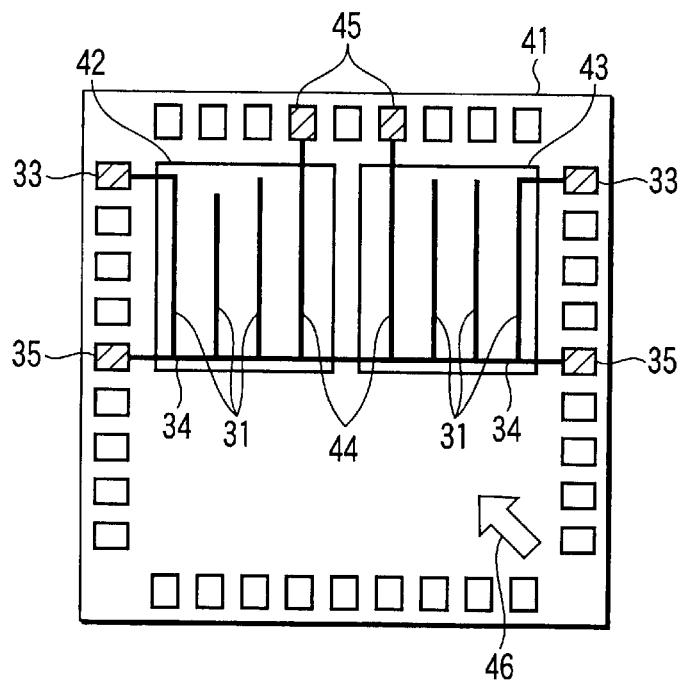
FIG. 6A is a plan view showing a semiconductor chip having a different structure from that of FIG. 5A.
Figure 6B:
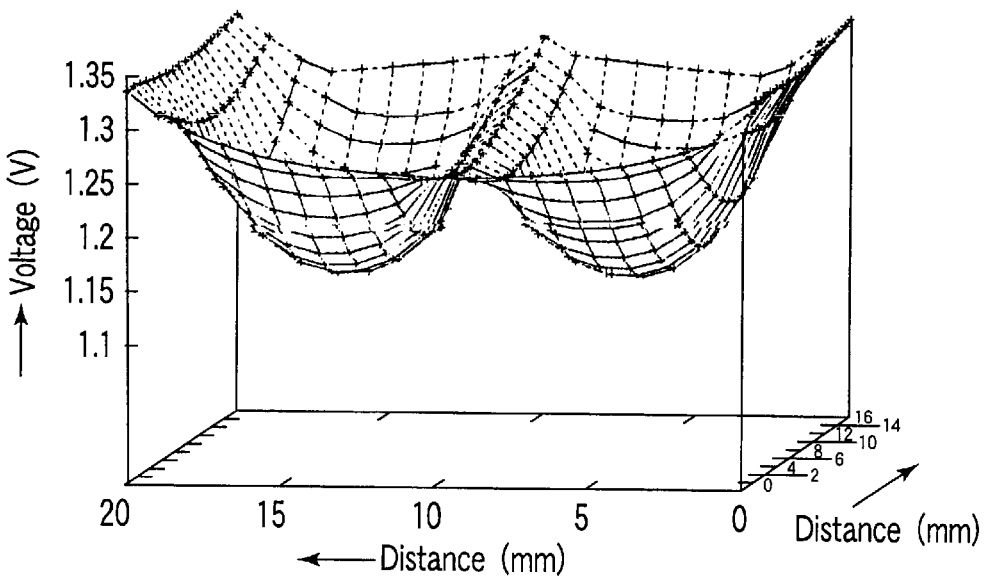
FIG. 6B is a characteristic diagram showing the result of simulation of the semiconductor chip shown in FIG. 6A.

FIG. 6 shows an example of a structure in which a power supply wiring is not formed in the second wirable region 21 in each DRAM macro, and FIG. 6B shows the a,result of simulation of the structure shown in FIG. 6A. As shown in FIG. 6B, when a power supply wiring is not formed in the second wirable region 21, it is hard to supply a voltage substantially to each of the first power supply wirings 31. Thereby, the drop in the electric potential at a central part of each DRAM macro is notable.

According to the first embodiment, the DRAM macro 11 has a plurality of memory cell arrays 13, and a plurality of second data lines 18 formed in the layer upper than the bit lines BL as first data line, along the first data line. The plurality of first wirable regions 20 are formed along these second data lines 18, furthermore, the second wirable region 21 is formed on the upper layer of the memory cell array 13 where the second data lines 18 are not formed in the direction orthogonal to the second data lines 18. Thus, there are first wirable regions 20 in parallel with the second data lines 18 and second wirable region 21 in the direction orthogonal to the second data lines 18. Thereby, it is possible to increase the degree of freedom of wiring and provide an effective wirable region.

Also, the plurality of first power supply wirings 31 are formed along the second data lines 18 corresponding to a plurality of memory cell arrays. The second data lines 18 are not formed on a memory cell array of the plurality of memory cell arrays which are positioned on one end, and the second power supply wiring 32 is formed on the same layer the second data lines 18 are formed, in the direction orthogonal to the second data lines 18. The second power supply wiring 32 is connected to one end of the first power supply wiring 31 in common. The other end of the first power supply wiring 31 is connected in common to the third power supply wiring 34 arranged so as to be orthogonal with the first power supply wiring 31. Therefore, it is possible to supply electric power to the plurality of first power supply wirings 31 by the second and third power supply wirings 32 and 34. Thus, it is possible to supply electric power equally the whole area of the DRAM macro and realize stable operation of the DRAM macro. Moreover, the second data lines 18 and the first to third power supply wirings 31, 32 and 34 are formed on the same wiring layer. Thereby, addition of a wiring layer is not required so manufacturing costs can be reduced.

Second Embodiment

Figure 7:
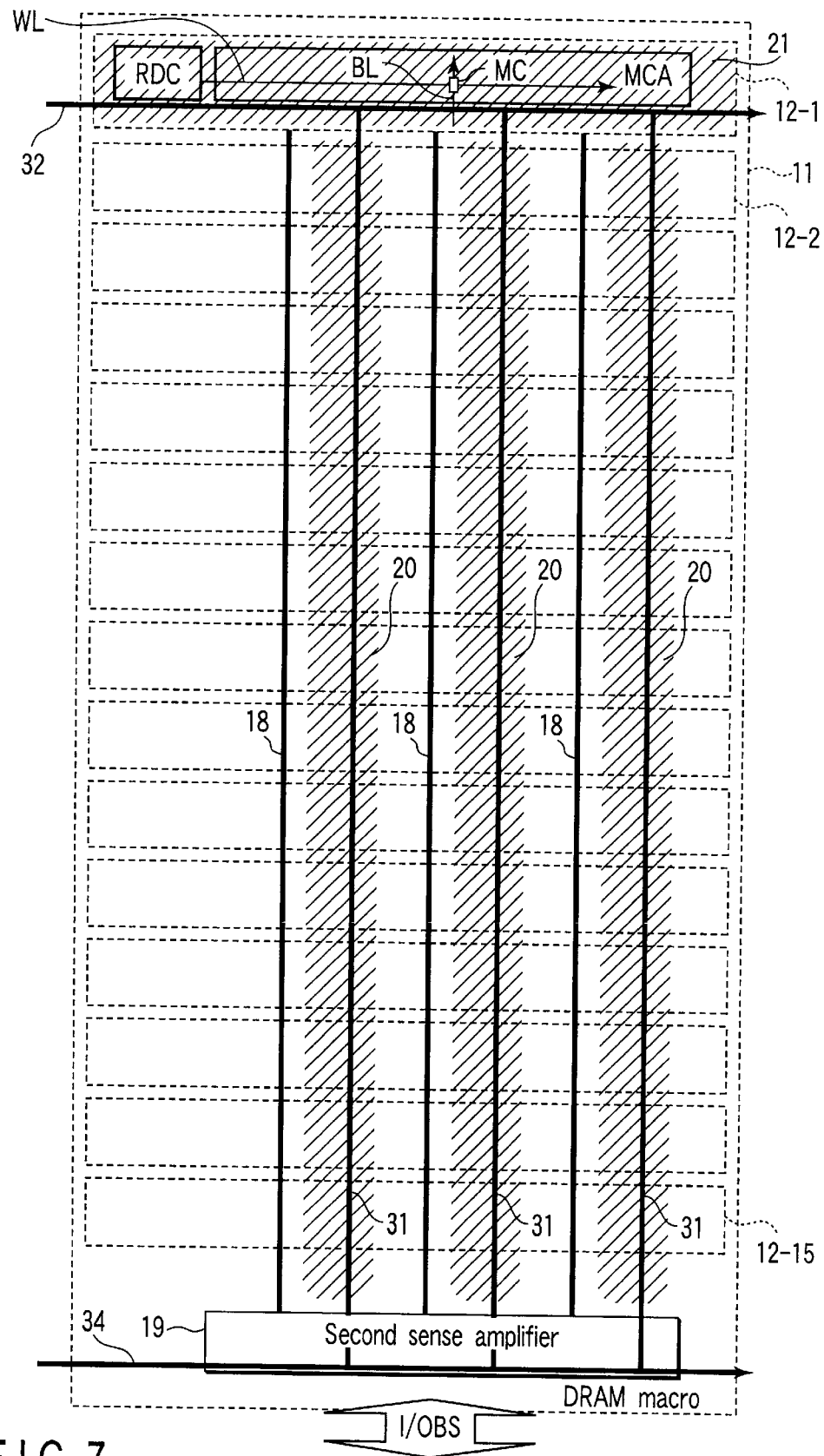
FIG. 7 is a plan view showing an example of a memory macro according to a second embodiment of the present invention.

FIG. 7 shows a second embodiment of the present invention, and in FIG. 7, the same parts as those in the first embodiment are identified by the same reference numerals. The second embodiment shows the case where the invention is applied to ASIC, and shows the case where a semiconductor chip is designed by using a DRAM macro as memory macro.

A DRAM macro shown in FIG. 7 differs from the DRAM macro shown in FIG. 3 only in the number of basic unit blocks, essentially the DRAM is equal to the DRAM macro shown in FIG. 3. Thus, in FIG. 7, the same parts as those in FIG. 3 are identified by the same reference numerals, and a detailed description is omitted.

The DRAM macro 11 shown in FIG. 7 has, for example, a storage capacity of 16 Mbit, and has 15 basic unit blocks 12-1, 12-2 to 12-15 arranged. In a known manufacturing technique, the size of one DRAM macro 11 is, for example, 5 mm×2 mm. In the DRAM macro 11 shown in FIG. 7, 128 data input-output-buses I/OBS are formed on the side where the second sense amplifier 19 is arranged. In this manner, when wide data input-output buses I/OBS are formed long, a large area is required. Thus, a logic circuit is arranged in the vicinity of the data input-output buses I/OBS to shorten the data input-output buses I/OBS. However, an extremely long and narrow chip reduces the number of chips producible from one sheet of wafer. Also, a chip having such a shape raises the problem of sealing a package. In consideration of the above, it is the best shape that four DRAM macros are arranged horizontally in the short side direction, and a chip is formed so as to be 10 mm×10 mm square.

Figure 8:
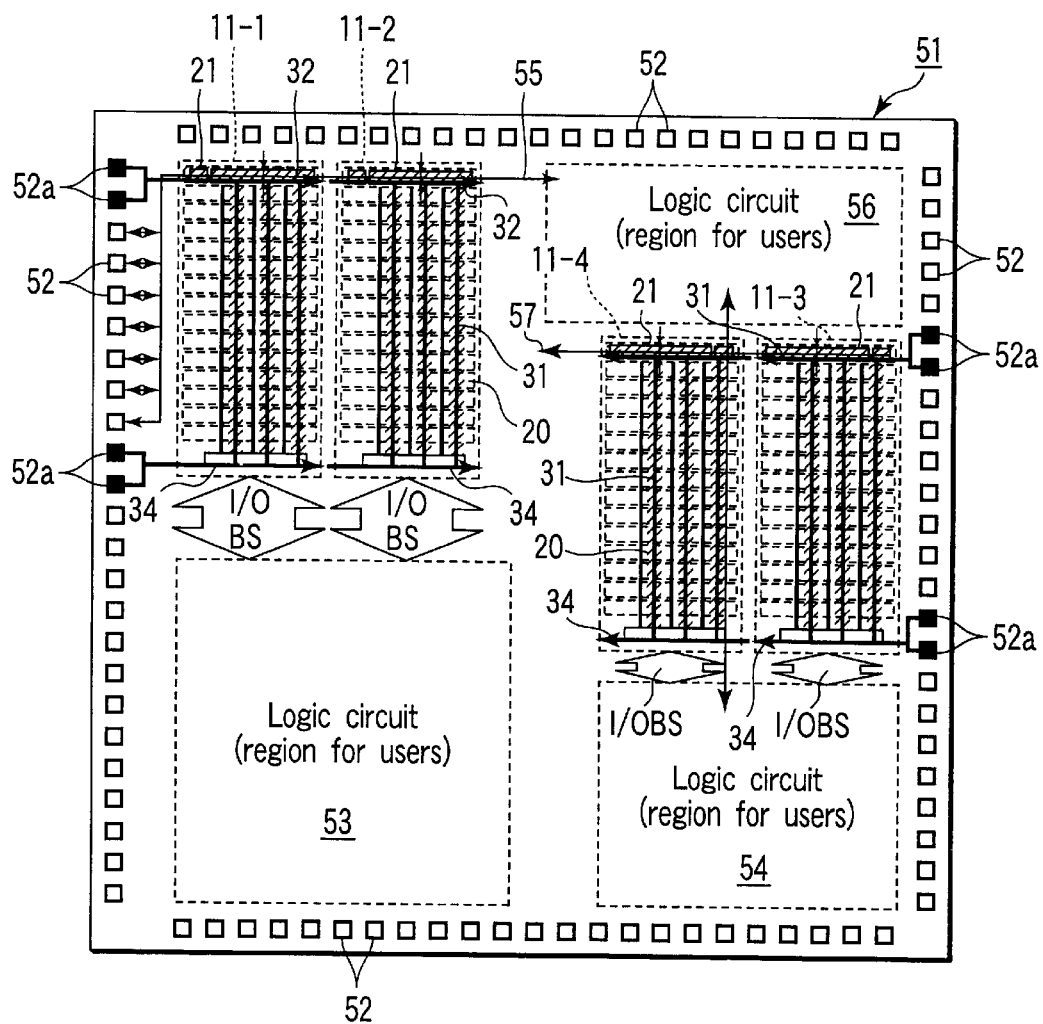
FIG. 8 is a plan view showing an example of a floor plan for a semiconductor chip using a memory macro shown in FIG. 7.

FIG. 8 shows an example of a floor plan for a semiconductor chip using four DRAM macros 11 shown in FIG. 7. The semiconductor chip 51 is substantially square. A plurality of pads 52 are arranged on a peripheral portion of the semiconductor chip 51. A DRAM macro 11-1 is formed on, for example, a corner of the semiconductor chip 51. A DRAM macro 11-2 is arranged on the opposite side against the pad in the DRAM macro 11-1 in parallel with the DRAM macro 11-1. The second and third power supply wirings 32 and 34 and the second wirable region 21 in the DRAM macro 11-2 are formed as a continuation of the second and third power supply wirings 32 and 34, and the second wirable region 21 in the DRAM macro 11-1.

Also, a DRAM macro 11-3 is arranged, for example, along one side of the semiconductor chip 51. A DRAM macro 11-4 is arranged on the opposite side against the pad in the DRAM macro 11-3 in parallel with the DRAM macro 11-3. The second and third power supply wirings 32 and 34 and the second wirable region 21 in the DRAM macro 11-4 are formed as a continuation of the second and third power supply wirings 32 and 34, and the second wirable region 21 in the DRAM macro 11-3.

The data input/output buses I/OBS of the DRAM macros 11-1 and 11-2 are connected to a logic circuit 53 formed in a region for users. Also, the data input/output buses I/OBS of the DRAM macros 11-3 and 11-4 are connected to a logic circuit 54 formed in a region for users.

Moreover, the second and third power supply wirings 32 and 34 in the DRAM macro 11-1 are connected to power supply pads 52a respectively. Electric power is supplied to the DRAM macro 11-2 via the second and third power supply wirings 32 and 34 in the DRAM macro 11-2 connected to the second and third power supply wirings 32 and 34, respectively, in the DRAM macro 11-1.

Also, the second and third power supply wirings 32 and 34 in the DRAM macro 11-3 are connected to a plurality of power supply pads 52a respectively. Electric power is supplied to the DRAM macro 11-4 via the second and third power supply wirings 32 and 34 in the DRAM macro 11-4 connected to the second and third power supply wirings 32 and 34, respectively, in the DRAM macro 11-3.

Also, the first wirable region 20 and the second wirable region 21 are opened for wirable regions for users. Thereby, a passing wiring 55 can be formed in the second wirable region 21 formed as a continuation of the DRAM macros 11-1 and 11-2. One end of the passing wiring 55 is connected to, for example, a plurality of the pads 52 and the other end thereof is connected to, for example, a logic circuit 56.

It can be considered that the passing wiring 55 and the power supply wiring 32 cross outside the DRAM macro 11-1. However, in a region between the DRAM macro 11-1 and pad, the limitation of wirings is eased. Thereby, in the region, it is possible to cross passing wirings and power supply wirings without increasing a wiring layer by using wiring in a lower layer than the power supply wirings.

More, it is possible to form passing wirings 57 for users as well as the above in the second wirable region 21 which is formed as a continuation of those in the DRAM macros 11-3 and 11-4.

According to the second embodiment, a plurality of DRAM macros are arranged so as to make the second and third power supply wirings 32 and 34 contact in each DRAM macro. Thereby, electric power is supplied via the DRAM macro formed in the vicinity of the power supply pad to the next DRAM macro. Thus, it is possible to ease a limitation of arrangement for DRAM macros because electric power can be supplied to a DRAM macro which is not adjacent to the power supply pad. If this is so, the power supply pad is not required opposite the data input/output bus I/OBS in the DRAM macro. Thereby, it is possible to increase the degree of freedom of a floor plan. Furthermore, the DRAM macro can be arranged in the vicinity of a center of a chip as well as the DRAM macros 11-2 and 11-4. Thereby, it is possible to ease a limitation of arrangement for DRAM macros.

Further, the first wirable region 20 and the second wirable region 21 are opened as wirable regions for users. Thereby, signal lines for users can be formed in the first and second wirable regions 20 and 21. Thus in wirings for users, it is possible to shorten them and transmit signals at high speed by reducing the number of bypass wirings.

Figure 9:
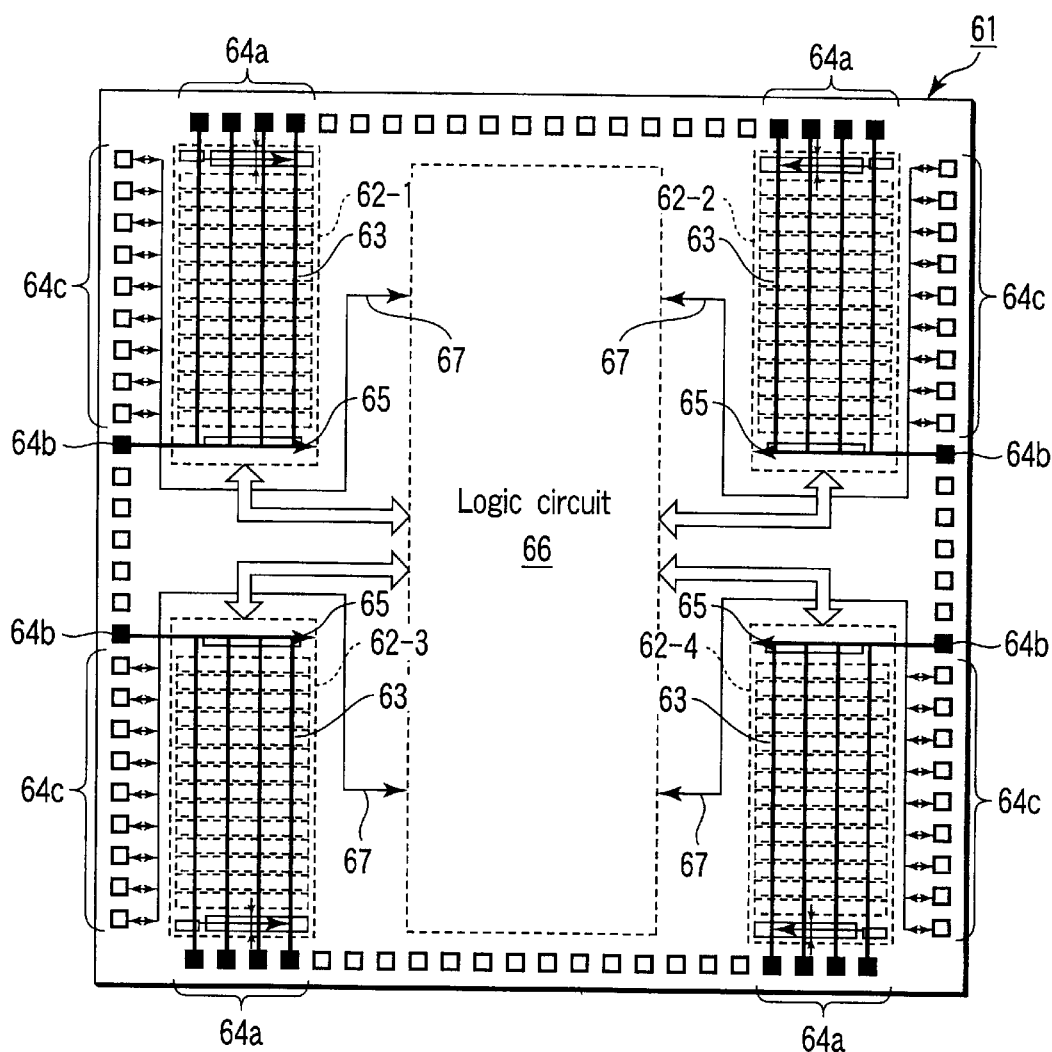
FIG. 9 is a plan view showing an example of a floor plan for a semiconductor chip using a DRAM macro shown in FIG. 6A.

On the other hand, FIG. 9 shows an example of a floor plan for a semiconductor chip using the DRAM macro shown in FIG. 6A.

The DRAM macro shown in FIG. 6A comprises strong power supply wirings in the data line direction. However, power supply wirings in the direction orthogonal to the data lines have a high resistance. It is required that power supply wirings in the data line direction are connected to power supply pads to make up for this defect. Therefore, it is required that four DRAM macros 62-1, 62-2, 62-3 and 62-4 are arranged so as to correspond to power supply pads in a semiconductor chip 61, respectively. Ends of a plurality of power supply wirings 63 are connected to a plurality of power supply pads 64a. Also, power supply wirings 65 orthogonal with the power supply wirings 63 are connected to power supply pads 64b. Therefore, arrangements of DRAM macros are limited because more pads than those in the second embodiment are required to supply electric power to each DRAM macro.

Also, the DRAM macros 62-1, 62-2, 62-3 and 62-4 do not have wirable regions in the direction orthogonal to the power supply wirings 63. Thereby, it is required that each wiring 67 connecting a plurality of signal pads 64c with logic circuits 66 arranged between the DRAM macros 62-1, 62-2, 62-3 and 62-4, respectively, bypasses the DRAM macros 62-1, 62-2, 62-3 and 62-4. Thereby, the length of the wiring line 65 is increased, which may reduce the signal transmission speed.

Since the DRAM macro does not have a wirable region in the direction orthogonal to the power supply wiring 63, it is hard that the plurality DRAM macros are arranged in the direction orthogonal to the power supply wiring 63 as well as the second embodiment.

It is obvious that the floor plan in the second embodiment is better than the floor plan shown in FIG. 9.

Third Embodiment

Figure 10:
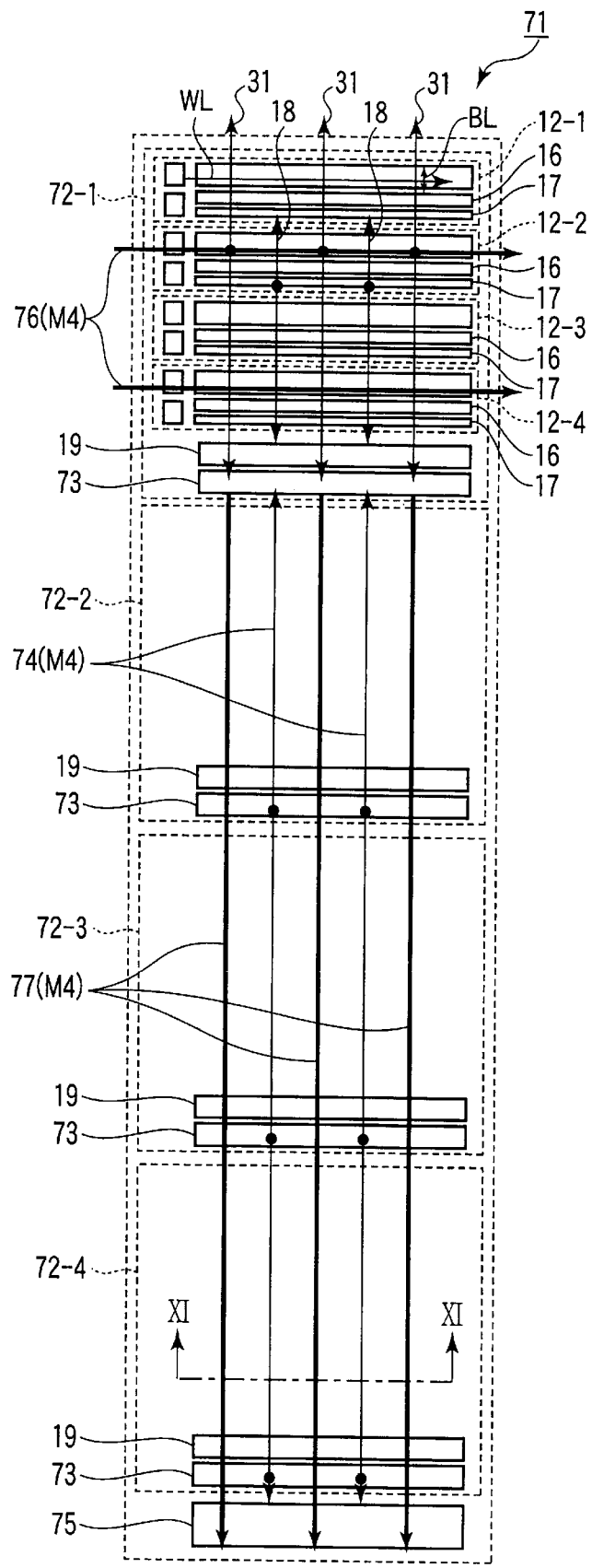
FIG. 10 is a plan view showing an example of memory macro according to a third embodiment of the present invention.

FIG. 10 shows a third embodiment of the present invention. In the third embodiment, data lines comprise a threelayered structure to operate at high speed. Furthermore, power supply wirings comprise a two-layered structure. In FIG. 10, the same parts as those in FIG. 1 and FIG. 3 are identified by the same reference numerals.

A DRAM macro 71 has basic unit blocks having a two-layered structure shown in FIG. 10. The basic unit block in the first layer is comprised of the basic unit blocks 12-1, 12-2, 12-3 and 12-4. The configuration of the basic unit blocks 12-1, 12-2, 12-3 and 12-4 are the same as those in the first and second embodiments. Basic unit blocks 72-1, 72-2, 72-3 and 72-4 in a second layer are comprised of four basic unit blocks 12-1, 12-2, 12-3 and 12-4, second sense amplifier 19 and selecting transistors 73. The first sense amplifier 16 in each of the basic unit blocks 12-1, 12-2, 12-3 and 12-4 is connected to the second sense amplifier 19 via the selecting transistor 17 and the second data lines 18.

A plurality of third data lines 74 are arranged in an upper layer of the basic unit blocks 72-2, 72-3 and 72-4 in the second layer. One ends of the third data lines 74 is connected to a third sense amplifier 75 adjoined to the basic unit block 72-4 in the second layer. Each second sense amplifier 19 in the basic unit blocks 72-1, 72-2, 72-3 and 72-4 in the second layer is connected to the third data line 74 via the selecting transistor 73.

The second sense amplifiers 19 composing the basic unit block 72-1 in the second layer positioned on one end of the DRAM macro 71, are adjoined to the basic unit block 72-1. Thereby, it is not necessary that the third data line 74 be formed in the upper layer of the basic unit block 72-1. A plurality of second power supply wirings 76 are formed in the direction orthogonal to the third data line 74 in the space by using the same wiring layer where the third data line 74 is formed. The second power supply wirings 76 are connected to the first power supply wirings 31 in the same layer where the second data lines 18 are formed. The second power supply wirings 76 correspond to the second and third power supply wirings 32 and 34 in the first and second embodiments.

On the other hand, the third data lines 74 are formed on other basic unit blocks 72-2, 72-3 and 72-4 in the second layer. However, there is a space between the third data lines 74 as well as the second data lines 18. Third power supply wirings 77 are arranged along the third data lines 74 in the same layer where the third data lines 74 are formed. Also the first power supply wiring 31 is formed in the same direction of the power supply wiring 77. Thereby, it is possible to highly reduce the total wiring resistance in the first and third power supply wirings 31 and 77.

Electric current supplied to the second power supply wiring 76 flows to the first and third power supply wirings 31 and 77 in the basic unit blocks 72-1, 72-2, 72-3 and 72-4. Thus, it is possible to supply electric power sufficiently to the DRAM macro 71 in all directions.

FIG. 11 is a cross sectional view taken along the XI—XI line in FIG. 10. In FIG. 11, the same parts as those in FIG. 10 are identified by the same reference numerals. As shown in FIG. 11, the second data lines 18 and the first power supply wirings 31 are comprised of wirings M3 in a third layer, and third data lines 74 and third power supply wirings 77 are comprised of wirings M4 in a fourth layer.

Here, a brief description will be given of the method of realizing high speed operations in the multilayered structure of data lines. The third data lines 74 having a length of several mm are too long, as shown in FIG. 10. Wiring delay is reduced by using upper layer wirings having low resistance and low coupling capacity. Even so, the coupling capacity of the third data lines 74 exceeds 1 pF. Therefore, a driver having the ability to drive a high electric current is needed for the third data lines 74. Thus, the width of the channel of the transistor composing the second sense amplifiers 19 and the third sense amplifiers 75 connected to the third data line 74 needs to be about 20 $\mu$m. The second data lines 18 have a short wiring length. This will involve reducing the coupling capacity of the parasiting wirings. The channel width of the transistor composing the first sense amplifiers 16 connected to many second data lines 18, is about 2 $\mu$m. That is to say, it is impossible to enlarge a transistor composing the first sense amplifiers 16 because of the small occupied area in a chip. Thus, it is important that the parasitic capacity of the second data lines 18 is low for realizing high speed operations.

Furthermore, as the channel width of the transistor configure to DRAM cells is about 0.2 $\mu$m, it is required that bit lines BL as first data lines connected to the transistor have low capacity. For example, it is required that the wiring capacity is not more than 100 fF to realize a high speed, e.g. 10 ns, operation.

On one hand, when a data line structure which can realize high speed operations is used, a power consumption increase to operate a semiconductor device at high speed occurs. As stated above, using the hierarchical data lines is impotent technique for high speed operations. However, if the electric potential of the power supply wiring drops because of its power consumption, it is impossible for it to operate at high speed.

According to the third embodiment, data lines have a hierarchical structure and power supply wirings have low resistance required to operate a semiconductor device. Thus, it is possible to prevent a drop in electric potential in the power supply wirings so that high speed operation can be attached. Moreover, data lines and power supply wirings must have the same hierarchical structure, so they are formed by the same production steps. Thereby producing costs are advantageously reduced.

Figure 12:
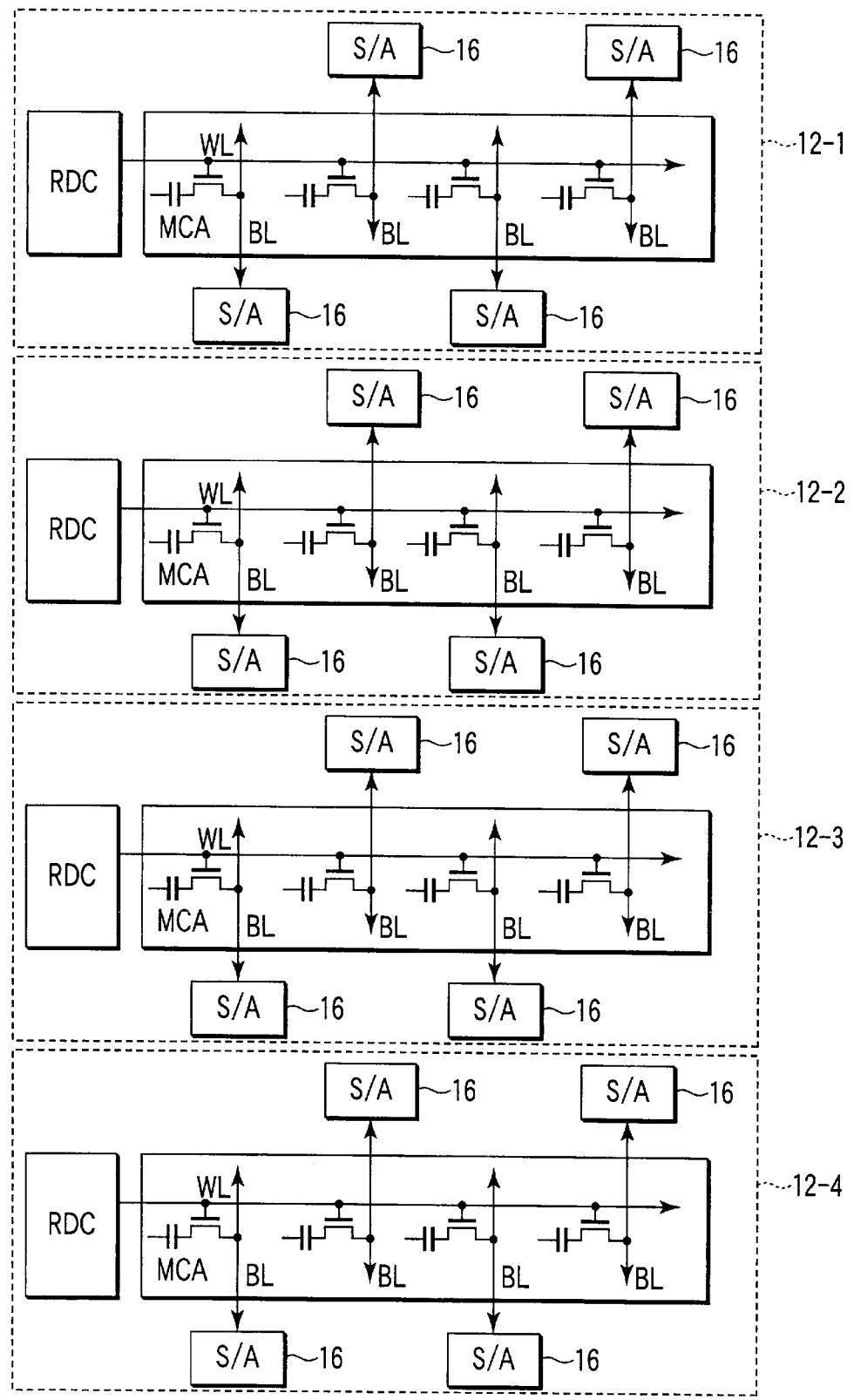
FIG. 12 is a structural diagram showing an example of a sense amplifier applied to the third embodiment.
Figure 13:
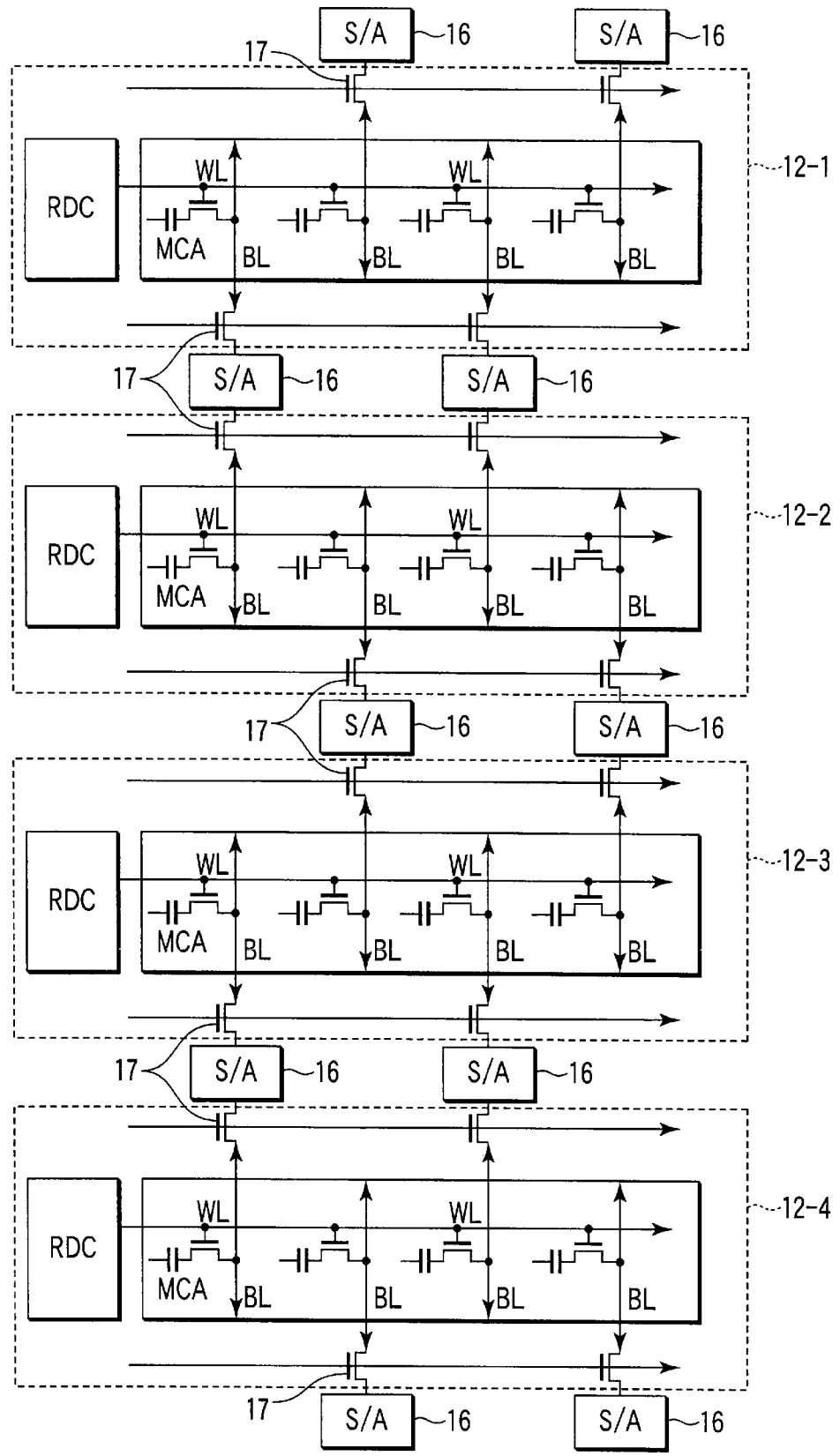
FIG. 13 is a structural diagram showing other example of a sense amplifier applied to the third embodiment.

FIGS. 12 and 13 show an example of a first sense amplifier applied to the basic units blocks 12-1 to 12-4 in the first layer. In the basic unit blocks 12-1 to 12-4 in the first layer, the interval between bit lines BL is made as narrow as possible by using a lithography technique. It is required that pitch of the sense amplifier is reduced.

FIG. 12 shows a case where the first sense amplifier 16 and the selecting transistors 17 are arranged both sides of the memory cell array MC, for example.

FIG. 13 shows the structure of a shared sense amplifier. In this case, the first sense amplifier 16 is shared with the adjacent memory cell array MCA. That is to say, the first sense amplifier 16 is connected to the first data line in the memory cell array via the selecting transistor 17. It is possible to further reduce the space the sense amplifier occupies.

The first and third embodiments explain that the present invention is applied to the DRAM macro. However the present invention is not limited to this, and can be applied to other memory macros.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of basic unit blocks arranged in a first direction, each basic unit block including:
   1) a memory cell array having a plurality of memory cells arranged in a matrix,
   2) a first selecting line, arranged in a second direction orthogonal with the first direction and configured to select a memory cell from the memory cells,
   3) a plurality of first data lines arranged in the first direction, each of said first data lines transmitting data from said selected memory cell, and
   4) sense amplifiers connected to said first data lines;
   second data lines, a number of which is smaller than a number of the plurality of the first data lines, formed in an upper layer of basic unit blocks of said plurality of basic unit blocks except a basic unit block which is positioned on one end, each of said second data lines being arranged in the first direction and being selectively connected to each of said first data lines;
   a first wiring arranged in an upper layer of the plurality of basic unit blocks, said first wiring being arranged in the first direction; and
   a second wiring arranged in an upper layer of the basic unit block of the plurality of basic unit blocks positioned on the one end, said second wiring being arranged in the second direction.

2. The device according to claim 1, wherein said first wiring is a first power supply wiring.

3. The device according to claim 2, wherein said second wiring is a second power supply wiring connected to the first power supply wiring.

4. The device according to claim 2, wherein said second wiring is a passing wiring passing through the upper layer of said basic unit blocks.

5. The device according to claim 1, further comprising a selecting transistor arranged in each basic unit block, wherein said selecting transistor connects said first data line and second data line.

6. A semiconductor device comprising:
   a plurality of first basic unit blocks arranged in a first direction, each first basic unit block including:
   1) a memory cell array having a plurality of memory cells arranged in a matrix,
   2) a first selecting line, arranged in a second direction orthogonal with the first direction and configured to select a memory cell from the memory cells,
   3) a first data line arranged in the first direction, said first data line transmitting data from said selected memory cell, and
   4) sense amplifiers connected to said first data lines;
   second data lines, a number of which is smaller than a number of the plurality of the first data lines, formed in the upper layer of the first basic unit blocks of said plurality of first basic unit blocks except a first basic unit block positioned on one end, each of said second data lines being arranged in the first direction and being selectively connected to each of said first data lines;
   a plurality of first power supply wirings arranged in an upper layer of the plurality of first basic unit blocks, said first power supply wirings being arranged in the first direction;
   a second power supply wiring arranged in an upper layer of the first basic unit block of the plurality of first basic unit blocks positioned on the one end, said second power supply wiring being arranged in the second direction and being connected to one end of said first power supply wirings;
   a third power supply wiring arranged in the same layer where said second data lines are formed, said third power supply wiring being arranged in the second direction and being connected to another ends of said first power supply wirings; and
   a wiring arranged in an upper layer of one first basic unit block of the plurality of first basic unit blocks which is positioned on the one end.

7. The device according to claim 6, further comprising a plurality of second basic unit blocks which adjoin the plurality of first basic unit blocks in directions of the second and third power supply wirings, wherein the second basic unit blocks have the same configurations as those of said first basic unit blocks and one ends of said second and third power supply wirings in said second basic unit blocks are connected to another ends of said second and third power supply wirings in said first basic unit blocks.

8. The device according to claim 6, wherein said wiring is a first passing wiring passing through the upper layer of said one first basic unit block.

9. The device according to claim 7, wherein said second basic unit blocks have a second passing wiring passing through the upper of one of said second basic unit blocks, one end of the second passing wiring being connected to the end of said first passing wiring.

10. The device according to claim 6, further comprising a selecting transistor arranged in each first basic unit block, wherein said selecting transistor connects said first data line and second data line.

11. A semiconductor device comprising:
   a semiconductor chip having a pad group including a plurality of power supply pads and a plurality of signal pads arranged on a peripheral portion of the semiconductor chip;
   a first memory macro arranged on one side of said semiconductor chip, said first memory macro being arranged along said pad group; and
   a second memory macro arranged in parallel with the first memory macro, said first memory macro being positioned between said pad group and said second memory macro;
   wherein said first and second memory macros have a plurality of basic unit blocks arranged in a first direction, each basic unit block including:
   1) a memory cell array having a plurality of memory cells arranged in a matrix;
   2) a first selecting line, arranged in a second direction orthogonal with the first direction and configured to select one memory cell from the memory cells;
   3) a plurality of first data lines arranged in the first direction, each of said first data lines transmitting data from said selected memory cell; and
   4) sense amplifiers connected to said first data lines;
   second data lines, a number of which is smaller than a number of the plurality of the first data lines, arranged in an upper layer of the plurality of basic unit blocks, each of said second data lines being arranged in the first direction and being selectively connected to each of said first data lines;
   a plurality of first power supply wirings arranged in the same layer where said second data lines are formed, the plurality of first power supply wirings being arranged in the first direction;
   a second power supply wiring arranged in an upper layer of the basic unit block of the plurality of basic unit blocks which is positioned on one end, said second power supply wiring being arranged in the second direction and being connected to one ends of said first power supply wirings;

a third power supply wiring arranged in the same layer where said second data lines are formed, said third power supply wiring being arranged in the second direction and being connected to another ends of the first power supply wirings; and a wiring arranged in the upper layer of the basic unit block of the plurality of the basic unit blocks which is positioned on the one end and arranged in the same layer where said second data lines are formed, said wiring being arranged along said second power supply wirings.

12. The device according to claim 11, wherein one ends of said second and third power supply wirings in said first memory macro are connected to said power supply pads.

13. The device according to claim 11, wherein the one end of said second and third power supply wirings in said second memory macro are connected to another ends of said second and third power supply wirings in said first memory macro.

14. The device according to claim 11, wherein said wiring in said first memory macro is connected to said wiring in said second memory macro.

15. The device according to claim 14, wherein said wirings in said first and second memory macros are passing wirings passing through the upper layers of said first and second memory macros.

16. The device according to claim 15, wherein said semiconductor chip comprises a logic circuit, wherein one end of said passing wiring passing through the upper layer of said first and second memory macros is connected to said signal pad, and another end thereof is connected to said logic circuit.

17. A semiconductor device comprising:

a plurality of first basic unit blocks arranged in a first direction;

a plurality of second basic unit blocks arranged in the first direction, each of said second basic unit blocks including the plurality of first basic unit blocks;

first data lines formed in each first basic unit block, said first data lines being arranged in the first direction;

second data lines, a number of which is smaller than a number of the first data lines, arranged on an upper layer of the first basic unit blocks, said second data lines being arranged in the first direction and being selectively connected to each of said first data lines;

a third data line arranged along said second data line in the upper layer of the first basic unit blocks of the plurality of first basic unit blocks except the basic unit block which is positioned on one end, said third data line being connected to said second data line;

a first power supply wiring arranged in the upper layer of the plurality of first basic unit blocks, said first power supply wiring being arranged along said second data line; and a second power supply wiring arranged along in the upper layer of one basic unit block in a plurality of the second basic unit blocks which is positioned on the one end, said second power supply wiring being arranged in the direction orthogonal to said first power supply wiring and being connected to said first power supply wiring.

18. The device according to claim 17, wherein said first basic unit blocks include:

a memory cell array having a plurality of memory cells;

selecting lines arranged in the second direction, said selecting line selecting one from said memory cells;

sense amplifiers connected to said first data line; and first selecting circuits connecting said first data line to said second data line.

19. The device according to claim 17, wherein said second basic unit block includes:

second sense amplifiers amplifying electric potential of said second data lines; and second selecting circuits selectively connecting said second data lines to corresponding ones of said third data lines.

20. The device according to claim 17, further comprising a third power supply wiring arranged in the upper layer of the second basic unit blocks except the basic unit block positioned on the one end, said third power supply wiring being arranged along said third data line.

* * * * *